(12) United States Patent
Wang et al.

(10) Patent No.: US 6,867,140 B2
(45) Date of Patent: Mar. 15, 2005

(54) METHOD OF POLISHING A MULTI-LAYER SUBSTRATE

(75) Inventors: Shumin Wang, Naperville, IL (US); Vlasta Brusic Kaufman, Geneva, IL (US); Steven K. Grumbine, Aurora, IL (US); Isaac K. Cherian, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 10/353,512

(22) Filed: Jan. 29, 2003

(65) Prior Publication Data

US 2003/0153184 A1 Aug. 14, 2003

Related U.S. Application Data

(62) Division of application No. 09/636,246, filed on Aug. 10, 2000
(60) Provisional application No. 60/148,813, filed on Aug. 13, 1999.

(51) Int. Cl.$^7$ ............................................. H01L 21/302
(52) U.S. Cl. ....................... 438/692; 438/693; 252/79.1
(58) Field of Search ............................... 438/691, 692, 438/693; 252/79.1

(56) References Cited

U.S. PATENT DOCUMENTS

| | | |
|---|---|---|
| 4,051,057 A | 9/1977 | Ericson et al. |
| 4,404,074 A | 9/1983 | Tomaszewski |
| 4,452,643 A | 6/1984 | Martin et al. |
| 4,875,973 A | 10/1989 | Heikkila et al. |
| 5,223,087 A | 6/1993 | Itani et al. |
| 5,366,542 A | 11/1994 | Yamada et al. |
| 5,770,095 A | 6/1998 | Sasaki et al. |
| 5,770,103 A | 6/1998 | Wang et al. |
| 5,773,364 A | 6/1998 | Farkas et al. |
| 5,788,830 A | 8/1998 | Sakamoto et al. |
| 5,855,633 A | 1/1999 | Simandl et al. |
| 5,897,375 A * | 4/1999 | Watts et al. ................ 438/693 |
| 5,954,997 A * | 9/1999 | Kaufman et al. .......... 252/79.1 |
| 6,001,730 A | 12/1999 | Farkas et al. |
| 6,022,264 A | 2/2000 | Cook et al. |
| 6,069,080 A | 5/2000 | James et al. |
| 6,099,394 A | 8/2000 | James et al. |
| 6,503,418 B2 * | 1/2003 | Sahota et al. .............. 252/79.1 |
| 2002/0081853 A1 | 6/2002 | Beitel et al. |

FOREIGN PATENT DOCUMENTS

| | | |
|---|---|---|
| EP | 0 845 512 | 6/1998 |
| EP | 0 896 042 | 2/1999 |
| EP | 0 913 442 | 5/1999 |
| JP | 3232980 | 10/1991 |
| JP | 11172467 | 6/1999 |
| WO | WO 98/36045 | 8/1998 |
| WO | WO 98/44061 | 10/1998 |
| WO | WO 98/48453 | 10/1998 |

* cited by examiner

*Primary Examiner*—Kin-Chan Chen

(57) ABSTRACT

The invention provides a method for polishing one or more layers of a multi-layer substrate that includes a first metal layer and a second layer comprising (i) contacting the first metal layer with a polishing system comprising a liquid carrier, at least one oxidizing agent, at least one polishing additive that increases the rate at which the system polishes at least one layer of the substrate, at least one stopping compound with a polishing selectivity of the first metal layer:second layer of at least about 30:1, wherein the stopping compound is a cationically charged nitrogen containing compound selected from compounds comprising amines, imines, amides, imides, and mixtures thereof, and a polishing pad and/or an abrasive, and (ii) polishing the first metal layer with the system until at least a portion of the first metal layer is removed from the substrate.

21 Claims, No Drawings

METHOD OF POLISHING A MULTI-LAYER SUBSTRATE

CROSS-REFERENCE TO RELATED PATENT APPLICATIONS

This patent application is a divisional of copending U.S. patent application Ser. No. 09/636,246, filed Aug. 10, 2000, which claims the benefit of U.S. Provisional Patent Application No. 60/148,813, filed Aug. 13, 1999.

TECHNICAL FIELD OF THE INVENTION

This invention pertains to a polishing system, composition, and a method of polishing a substrate, particularly a multi-layer substrate that includes a first metal layer and a second layer.

BACKGROUND OF THE INVENTION

Integrated circuits are made up of millions of active devices formed in or on a substrate, such as a silicon wafer. The active devices are chemically and physically connected into a substrate and are interconnected through the use of multilevel interconnects to form functional circuits. Typical multilevel interconnects comprise a first metal layer, an interlevel dielectric layer, and sometimes a third and subsequent metal layer. Interlevel dielectrics, such as doped and undoped silicon dioxide ($SiO_2$) and/or low-κ dielectrics are used to electrically isolate the different metal layers.

The electrical connections between different interconnection levels are made through the use of metal vias. U.S. Pat. No. 5,741,626, for example, describes a method for preparing dielectric TaN layers. Moreover, U.S. Pat. No. 4,789,648 describes a method for preparing multiple metallized layers and metallized vias in insulator films. In a similar manner, metal contacts are used to form electrical connections between interconnection levels and devices formed in a well. The metal vias and contacts may be filled with various metals and alloys, such as, for example, titanium (Ti), titanium nitride (TiN), aluminum copper (Al—Cu), aluminum silicon (Al—Si), copper (Cu), tungsten (W), and combinations thereof (hereinafter referred to as "via metals").

The via metals generally employ an adhesion layer (i.e., a barrier film), such as a titanium (Ti), titanium nitride (TiN), tantalum (Ta), tantalum nitride (TaN), tungsten (W), or tungsten nitride (WN) barrier film, to adhere the via metals to the $SiO_2$ substrate. At the contact level, the barrier film acts as a diffusion barrier to prevent the via metals from reacting with $SiO_2$.

In one semiconductor manufacturing process, metal vias and/or contacts are formed by a blanket metal deposition followed by a chemical-mechanical polishing (CMP) step. In a typical process, via holes are etched through an interlevel dielectric (ILD) to interconnection lines or to a semiconductor substrate. Next, a barrier film is formed over the ILD and is directed into the etched via hole. Then, a via metal is blanket-deposited over the barrier film and into the via hole. Deposition is continued until the via hole is filled with the blanket-deposited metal. Finally, the excess metal is removed by chemical-mechanical polishing (CMP) to form metal vias. Processes for manufacturing and/or CMP of vias are disclosed in U.S. Pat. Nos. 4,671,851, 4,910,155, and 4,944,836.

Typical metal CMP systems contain an abrasive material, such as silica or alumina, suspended in an oxidizing, aqueous medium. U.S. Pat. No. 5,244,534, for example, discloses a system containing alumina, hydrogen peroxide, and either potassium or ammonium hydroxide, which is useful in removing tungsten with little removal of the underlying insulating layer. U.S. Pat. No. 5,209,816 discloses a system useful for polishing aluminum that comprises perchloric acid, hydrogen peroxide, and a solid abrasive material in an aqueous medium. U.S. Pat. No. 5,340,370 discloses a tungsten polishing system comprising potassium ferricyanide, potassium acetate, acetic acid, and silica. U.S. Pat. No. 5,391,258 and U.S. Pat. No. 5,476,606 disclose systems for polishing a composite of metal and silica which includes an aqueous medium, abrasive particles and an anion which controls the rate of silica removal. U.S. Pat. No. 5,770,095 discloses polishing systems comprising an oxidizing agent, a chemical agent, and an etching agent selected from aminoacetic acid and amidosulfuric acid. Other polishing systems for use in CMP applications are described in U.S. Pat. Nos. 4,956,313, 5,137,544, 5,157,876, 5,354,490, and 5,527,423.

Barrier films of titanium, titanium nitride, and like metals, such as tungsten, are chemically active in general. Thus, such barrier films are similar in chemical nature to via metals. Consequently, a single system can be used effectively to polish both Ti/TiN barrier films and via metals at similar rates. Ta and TaN barrier films, however, are significantly different from Ti, TiN, and like barrier films. Ta and TaN are relatively inert in chemical nature as compared to Ti and TiN. Accordingly, the aforementioned systems are significantly less effective at polishing tantalum layers than they are at polishing titanium layers (e.g., the tantalum removal rate is significantly lower than the titanium removal rate). While via metals and barrier metals are conventionally polished with a single system due to their similarly high removal rates, joint polishing of via metals and tantalum and similar materials using conventional polishing systems results in undesirable effects, such as oxide erosion and via metal dishing.

Consequently, there remains a need for a system, composition, and/or method of polishing a substrate comprising a first metal layer and a second layer in a manner such that planarization efficiency, uniformity, and removal rate of the first metal layer are maximized and planarization of the second layer is minimized, thereby minimizing undesirable effects, such as first metal layer dishing, surface imperfections, and damage to underlying topography. The invention provides such a system, composition, and method. These and other characteristics and advantages of the present invention will be apparent from the description of the invention provided herein.

BRIEF SUMMARY OF THE INVENTION

The present invention provides a system for polishing one or more layers of a multi-layer substrate that includes a first metal layer and a second layer comprising (i) a liquid carrier, (ii) at least one oxidizing agent, (iii) at least one polishing additive that increases the rate at which the system polishes at least one layer of the substrate, (iv) at least one stopping compound with a polishing selectivity of the first metal layer:second layer of at least about 30:1, wherein the stopping compound is a cationically charged nitrogen containing compound selected from compounds comprising amines, imines, amides, imides, and mixtures thereof, and (v) a polishing pad and/or an abrasive.

The present invention also provides a method of polishing a substrate comprising contacting a surface of a substrate with the aforementioned system and polishing at least a portion of the substrate therewith. Moreover, the present invention provides a method for polishing one or more layers of a multi-layer substrate that includes a first metal layer and a second layer comprising (a) contacting the first metal layer with the system, and (b) polishing the first metal layer with the system until at least a portion of the first metal layer is removed from the substrate.

Moreover, the present invention provides a composition for polishing one or more layers of a multi-layer substrate that includes a first metal layer and a second layer comprising (i) liquid carrier, (ii) at least one oxidizing agent, (iii) at least one polishing additive that increases the rate at which the system polishes at least one layer of the substrate, and (iv) at least one stopping compound with a polishing selectivity of the first metal layer:second layer of at least about 30:1, wherein the stopping compound is a cationically charged nitrogen containing compound selected from compounds comprising amines, imines, amides, imides, and mixtures thereof, to be used with (v) a polishing pad and/or an abrasive.

DETAILED DESCRIPTION OF THE INVENTION

The present invention provides a system, composition, and method for polishing one or more layers of a multi-layer substrate that includes a first metal layer and a second layer. The system comprises (i) a liquid carrier, (ii) at least one oxidizing agent, (iii) at least one polishing additive that increases the rate at which the system polishes at least one layer of the substrate, (iv) at least one stopping compound with a polishing selectivity of the first metal layer:second layer of at least about 30:1, wherein the stopping compound is a cationically charged nitrogen containing compound selected from compounds comprising amines, imines, amides, imides, and mixtures thereof, and (v) a polishing pad and/or an abrasive. Components (i), (ii), (iii), and (iv) of the system of the present invention, hereinafter referred to collectively referred to as "the liquid portion of the system," form a composition that can be used with component (v). The abrasive forms part of the liquid portion of the system when present and suspended in the liquid carrier.

The system of the present invention can be used to polish any suitable substrate, especially one or more layers of a multi-layer substrate. Preferably, the system of the present invention is used to polish a multi-layer substrate that includes a first metal layer, a second layer, and optionally one or more additional layers. Suitable first metal layers include, for example, copper (Cu), aluminum (Al), aluminum copper (Al—Cu), aluminum silicon (Al—Si), titanium (Ti), titanium nitride (TiN), tungsten (W), tungsten nitride (WN), noble metals (e.g., iridium (Ir), ruthenium (Ru), gold (Au), silver (Ag), and platinum (Pt)), and combinations thereof. Suitable second layers include, for example, titanium (Ti), titanium nitride (TiN), tantalum (Ta), tantalum nitride (TaN), tungsten (W), tungsten nitride (WN), oxides (e.g., silicon dioxide), low-κ materials and dielectrics (e.g., porous silica, fluorine-doped glass, carbon-doped glass, and organic polymers), and combinations thereof. The system of the present invention is particularly well suited for polishing a substrate comprising a first metal layer of copper or a copper alloy (i.e., a combination of copper and one or more metals), an adhesive layer of Ta or TaN, and one or more oxide layers.

The liquid carrier can be any suitable carrier (e.g., solvent). Suitable liquid carriers include, for example, aqueous carriers (e.g., water) and non-aqueous carriers. Preferably, the liquid carrier is water.

The oxidizing agent can be any suitable oxidizing agent. Suitable oxidizing agents include, for example, one or more per-compounds, which comprise at least one peroxy group (—O—O—). Suitable per-compounds include, for example, peroxides, persulfates (e.g., monopersulfates and dipersulfates), percarbonates, and acids thereof, and salts thereof, and mixtures thereof. Other suitable oxidizing agents include, for example, oxidized halides (e.g., chlorates, bromates, iodates, perchlorates, perbromates, periodates, and acids thereof, and mixtures thereof, and the like), perboric acid, perborates, percarbonates, peroxyacids (e.g., peracetic acid, perbenzoic acid, m-chloroperbenzoic acid, salts thereof, mixtures thereof, and the like), permanganates, chromates, cerium compounds, ferricyanides (e.g., potassium ferricyanide), mixtures thereof, and the like. Preferred oxidizing agents include, for example, hydrogen peroxide, urea-hydrogen peroxide, sodium peroxide, benzyl peroxide, di-t-butyl peroxide, peracetic acid, monopersulfuric acid, dipersulfuric acid, iodic acid, and salts thereof, and mixtures thereof.

Any suitable amount of the oxidizing agent can be present in the system of the present invention. Preferably, the oxidizing agent is present in the liquid portion of the system in an amount of about 0.1–30 wt. %. More preferably, the oxidizing agent is present in the liquid portion of the system in an amount of about 0.3–17 wt. %. Most preferably, the oxidizing agent is present in the liquid portion of the system in an amount of about 0.5–10 wt. %.

The polishing additive can be any suitable compound that increases the rate at which the system polishes at least one layer of the substrate. Suitable polishing additives include, for example, compounds that bind to copper. Preferably, at least one polishing additive is an organic polishing additive. It is also preferable for the polishing additive to be at least one compound selected from the group consisting of a phosphorous-containing compound, a nitrogen-containing compound, a sulfur-containing compound, an oxygen-containing compound, and mixtures thereof.

The polishing additive can be any suitable phosphorous-containing compound. Suitable phosphorous-containing compounds include, for example, phosphates (e.g., pyrophosphates, tri-phosphates, condensed phosphates), phosphonic acids (e.g., mono-phosphonic acids, di-phosphonic acids, tri-phosphonic acids, poly-phosphonic acids), and salts of phosphonic acids. Preferred phosphorous-containing compounds include, for example, pyrophosphates, phosphonoacetic acid, ethylene diphosphonic acid, 1-hydroxyethylidene-1,1-diphosphonic acid, and mixtures thereof. Preferred phosphorous-containing compounds also include, for example, $M_n^{+1}H_{3-n}PO_4$ and $M_m^{+1}H_{4-m}P_2O_7$, wherein $M^{+1}$ is a cationic species (e.g., Na, K, Cs, Rb, $NH_4^+$), n=0–3, and m=0–4. Moreover, a preferred phosphorous-containing compound is R—O—$PO_3$, wherein R is an organic moiety selected from the group consisting of alkyl, aryl, cyclic, and aromatic groups having from 1–18 carbon atoms.

The polishing additive also can be any suitable nitrogen-containing compound. Suitable nitrogen-containing compounds comprise, for example, one or more groups selected from amines, amides, amino acids, imines, imides, imino acids, nitriles, nitros (R—$NO_2$), and mixtures thereof. Accordingly, suitable nitrogen-containing compounds can comprise, for example, one or more groups selected from primary amines, secondary amines, tertiary amines, amino alcohols, hydroxylated amines, and mixtures thereof.

Preferably, at least one polishing additive comprises the structure XY—$NCR^1R^2CR^3R^4N$—X'Y', wherein X, Y, X', Y', $R^1$, $R^2$, $R^3$, and $R^4$ are selected from the group consisting of hydrogen (H) atoms, heteroatom-containing functional groups, alkyl groups, heteroatom-containing alkyl groups, cyclic groups, heteroatom-containing cyclic groups, aromatic groups, heteroatom-containing aromatic groups, and combinations thereof. More preferably, at least one polishing additive comprises the structure XY—NCR$^1$R$^2$CR$^3$R$^4$N—X'Y', wherein X and X' are H atoms, and wherein Y, Y', $R^1$, $R^2$, $R^3$, and $R^4$ are selected from the group consisting of hydrogen (H) atoms, heteroatom-containing functional groups, alkyl groups, heteroatom-containing alkyl groups, cyclic groups, heteroatom-containing cyclic groups, aromatic groups, heteroatom-containing aromatic groups, and combinations thereof. Even more preferably, at least one polishing additive comprises the structure XY—NCR$^1$R$^2$CR$^3$R$^4$N—X'Y', wherein X, Y, X', and Y' are H atoms, and wherein $R^1$, $R^2$, $R^3$, and $R^4$ are selected from the group consisting of hydrogen (H) atoms, heteroatom-containing functional groups, alkyl groups, heteroatom-containing alkyl groups, cyclic groups, heteroatom-containing cyclic groups, aromatic groups, heteroatom-containing aromatic groups, and combinations thereof. In this regard, nitrogen-containing compounds that consist of primary amine groups are preferred over nitrogen-containing compounds that comprise secondary amine groups and/or tertiary amine groups, alone or in combination with primary amine groups. Moreover, it is suitable for at least one polishing additive to comprise the structure as described above, wherein the structure is in the form of a polymer comprising about four or more (e.g., about 10 or more, about 15 or more, about 20 or more, about 30 or more, about 40 or more, or even about 50 or more) dissimilar, similar, or even identical adjoined structures. Most preferably, the nitrogen-containing compound is selected from the group consisting of polyethylenimine, 1,3-diamino-2-propanol, iminodiacetic acid, 2-amino-1-butanol, ethylenediamine, aminoethylethanolamine, 2,2'-aminoethoxyethanol, and mixtures thereof.

"Heteroatom" is defined herein as any atom other than carbon and hydrogen atoms. Suitable heteroatom-containing functional groups include, for example, hydroxyl groups, carboxylic acid groups, ester groups, ketone groups, amino groups (e.g., primary, secondary, and tertiary amino groups), amido groups, imido groups, thiol ester groups, thioether groups, nitrile groups, nitros groups, halogen groups, and combinations thereof. "Alkyl groups" are defined herein as any suitable alkyl group (e.g., a $C_1$–$C_{30}$ alkyl group, a $C_1$–$C_{24}$ alkyl group, a $C_1$–$C_{18}$ alkyl group, a $C_1$–$C_{12}$ alkyl group, or even a $C_1$–$C_6$ alkyl group) such as, for example, linear, branched, cyclic, saturated or unsaturated, aromatic or heteroaromatic alkyl groups. "Cyclic groups" are defined herein as any suitable cyclic group (e.g., a cyclic group having 4–20 members, such as a $C_4$–$C_{20}$ cyclic group).

The polishing additive can be any suitable sulfur-containing compound. Suitable sulfur-containing compounds include, for example, thiols, thioesters, thioethers, (R'C)(O)(SR") carbothiolic acids, (RC)(O)(SH) carbothionic acids, (RCS)(OH) thiocarboxylic acids, sulfonic acids, thiosalicylic acids, salts thereof and mixtures thereof, wherein R, R' and R" are selected from the group consisting of alkyl, aryl, cyclic, and aromatic groups having from 1–18 carbon atoms. Preferred sulfur-containing compounds include, for example, thiodiacetic acid, thiosalicylic acids, and a mixture thereof.

The polishing additive can be any suitable oxygen-containing compound. Suitable oxygen-containing compounds include, for example, hydroxylates, carbonylates, carboxylates, and acids thereof. Suitable carboxylic acids include, for example, di-carboxylic acids, tri-carboxylic acids, and poly-carboxylic acids. Preferred oxygen-containing compounds include, for example, malonic acid, oxalic acid, citric acid, tartaric acid, succinic acid, malic acid, adipic acid, salts thereof, and mixtures thereof.

Suitable polishing additives also include one or more compounds selected from the group consisting of (i) compounds that are both phosphorous-containing compounds and nitrogen-containing compounds, (ii) compounds that are both phosphorous-containing compounds and sulfur-containing compounds, (iii) compounds that are both nitrogen-containing compounds and sulfur-containing compounds, and (iv) compounds that are phosphorous-containing compounds, nitrogen containing compounds, and sulfur-containing compounds. Preferred polishing additives include, for example, compounds selected from the group consisting of 2-aminoethylphosphonic acid, amino (trimethylenephosphonic acid), diethylenetriaminepenta (methylenephosphonic acid), hexamethylenediamine-tetra (methylenephosphonic acid), and mixtures thereof. Moreover, preferred polishing additives include, for example, phosphonic compounds containing primary, secondary and/or tertiary amines, such as, for example, N-(phosphonomethyl)iminodiacetic acid, 2-aminoethyl dihydrogen phosphate, 2-aminoethylphosphonic acid, 2-aminoethylphosphonic acid, aminotri (methylenephosphonic acid) (i.e., Dequest® 2000 product), 1-hydroxyethylidene-1,1-diphosphonic acid (i.e., Dequest® 2010 product), and diethylenetriaminepenta (methylenephosphonic acid) (i.e., Dequest® 2060 product).

The polishing additive can be present in the system of the present invention in any suitable concentration. Preferably, the polishing additive is present in the liquid portion of the system in an amount ranging from about 0.05–10 wt. %. More, preferably, the polishing additive is present in the liquid portion of the system in an amount ranging from about 0.3–5 wt. %.

The stopping compound can be any suitable compound that inhibits the ability of the system to polish at least a portion of one or more layers of a multi-layer substrate. Suitable stopping compounds interact with (e.g., adhere to) the first metal layer, the second layer, and/or the one or more additional layers of a multi-layer substrate as described above and at least partially inhibit the removal of the layer(s) by the system of the present invention. Preferably, the stopping compound interacts with (e.g., adheres to) a second layer of a multi-layer substrate as described above and at least partially inhibits the removal of the second layer by the system. The term "at least partially inhibits" as used herein means that the system has a polishing selectivity of the first metal layer:second layer (e.g., Cu:Ta/TaN) of at least about 10:1, preferably at least about 30:1, more preferably at least about 50:1, and most preferably at least about 100:1.

The stopping compound can be any suitable cationically charged nitrogen-containing compound selected from the group of compounds comprising amines, imines, amides, imides, polymers thereof, and mixtures thereof. Suitable stopping compounds also include, for example, cationically charged nitrogen-containing compounds selected from the group of compounds comprising amines, imines, amides, imides, polymers thereof, and mixtures thereof, wherein the stopping compound is not a sulfur-containing compound or an azole compound. The term "cationically charged" as used herein means that a portion (e.g., about 5% or more, about 10% or more, about 15% or more, or about 20% or more) of the stopping compound in the liquid portion of the system is in cationic form at the operating pH of the system of the present invention. Preferably, the stopping compound has a pKa value that is 1 or more units greater than the operating pH of the liquid portion of the system. For example, in a system with a pH of 6.5, preferred stopping compounds would have a pKa value of about 7.5 or more. Preferred stopping compounds also are oppositely charged from the surface charge of the second layer of the substrate layer. Suitable stopping compounds include, for example, compounds comprising primary amines, secondary amines, tertiary amines, quaternary amines (i.e., quaternary ammonium salts), etheramines, oligomeric amines, oligomeric imines, oligomeric amides, oligomeric imides, polymeric amines, polymeric imines, polymeric amides, polymeric imides, or mixtures thereof. Moreover, suitable stopping compounds include, for example, amino acids, amino alcohols, amino ether alcohols, or mixtures thereof. Preferred stopping compounds also include, for example, polyetheramines, polyethylenimines, $N_4$-amino-(N,N'-bis-[3-aminopropyl] ethylenediamine), 4,7,10-trioxatridecane-1,13-diamine, 3,3-dimethyl-4,4-diaminodicyclohexylmethane, 2-phenylethylamine, N,N-dimethyldipropylenetriamine, 3-[2-methoxyethoxy]propylamine, dimethylaminopropylamine, 1,4-bis(3-aminopropyl) piperazine, and mixtures thereof. In addition, preferred stopping compounds include, for example, isophorone diamine, hexamethylenediamine, cyclohexyl-1,3-propanediamine, thiomicamine, (aminopropyl) 1,3-propanediamine, tetraethylenepentamine, tetramethylbutanediamine, propylamine, diaminopropanol, aminobutanol, (2-aminoethoxy)ethanol, or mixtures thereof.

The system of the present invention can comprise any suitable combination of at least one polishing additive and at least one stopping compound. For example, the system can comprise polyethylenimine and at least one polishing additive selected from the group consisting of a carboxylic acid (preferably, a di-, tri-, or poly-carboxylic acid), a phosphate (preferably, a pyrophosphate, a tri-phosphate, or a condensed phosphate), an acid thereof, and a phosphonic acid (preferably, a di-, tri-, or poly-phosphonic acid). The system also can comprise at least one polishing additive selected from the group consisting of a carboxylic acid (preferably, a di-, tri-, or poly-carboxylic acid), a phosphate (preferably, a pyrophosphate, a tri-phosphate, or a condensed phosphate), an acid thereof, and a phosphonic acid (preferably, a di-, tri-, or poly-phosphonic acid) and at least one stopping compound comprising two or more, three or more, four or more, five or more, or even six or more nitrogen atoms (e.g., at least one stopping compound comprising two or more amine groups, at least one stopping compound comprising two or more primary amine groups, at least one stopping compound comprising two or more amino groups and 4 or more carbon atoms, or at least one stopping compound comprising two or more primary amine groups containing 3 or more carbon atoms). Moreover, the system can comprise at least one polishing additive selected from the group consisting of a carboxylic acid (preferably, a di-, tri-, or poly-carboxylic acid), a phosphate (preferably, a pyrophosphate, a tri-phosphate, or a condensed phosphate), an acid thereof, and a phosphonic acid (preferably, a di-, tri-, or poly-phosphonic acid) and a quaternary ammonium salt comprising the structure $NR^1R^2R^3R^4$, wherein $R^1$, and $R^2$ are methyl groups and $R^3$ and $R^4$ are selected from the group consisting of hydrogen (H) atoms, heteroatom-containing functional groups, alkyl groups, heteroatom-containing alkyl groups, cyclic groups, heteroatom-containing cyclic groups, aromatic groups, heteroatom-containing aromatic groups, and combinations thereof. In addition, the system can comprise at least one polishing additive selected from the group consisting of a carboxylic acid (preferably, a di-, tri-, or poly-carboxylic acid), a phosphate acid (preferably, a pyrophosphate, a tri-phosphate, or a condensed phosphate), an acid thereof, and a phosphonic acid (preferably, a di-, tri-, or poly-phosphonic acid) and at least one stopping compound comprising an aminopropyl group and/or at least one stopping compound having a molecular weight (MW) of about 80 or more (e.g., a MW of about 100 or more, a MW of about 250 or more). Furthermore, the system can comprise a peroxide, aminotri(methylenephosphonic acid), and 1,4-bis(3-aminopropyl)piperazine, and optionally, at least one passivation film forming agent comprising one or more 5–6 member heterocyclic nitrogen-containing rings. The system also can comprise a peroxide, tartaric acid, and a polyethylenimine, and, optionally, at least one passivation film forming agent comprising one or more 5–6 member heterocyclic nitrogen-containing rings.

The stopping compound can be present in the system of the present invention in any suitable concentration. It is suitable, for example, for the stopping compound to be present in the liquid portion of the system in a concentration of about 5 wt. % or less (e.g., about 0.001–5 wt. %). Preferably, the stopping compound is present in the liquid portion of the system in a concentration of about 3 wt. % or less (e.g., about 0.05 to about 3 wt. %).

The system of the present invention can comprise any suitable polishing pad and/or abrasive. It is suitable, for example, for the system of the present invention to comprise a polishing pad (e.g., an abrasive pad or a non-abrasive pad) and/or an abrasive that is suspended in the liquid carrier (e.g., water) of the system, thereby being a part of the liquid portion of the system. Moreover, it is suitable for the system of the present invention to comprise a polishing pad (e.g., an abrasive pad or a non-abrasive pad), wherein no abrasive is suspended in the liquid carrier of the system.

The polishing pad can be any suitable abrasive or non-abrasive pad. Suitable polishing pads are described, for example, in U.S. Pat. Nos. 5,849,051 and 5,849,052. Suitable polishing pads also include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, and coformed products thereof, and mixtures thereof. When an abrasive is fixed (e.g., embedded), in whole or in part, in or on the polishing pad of the system, such fixation on the polishing pad can be accomplished in any suitable manner.

Suitable abrasives include, for example, metal oxide abrasives, such as, for example, alumina, silica, titania, zirconia, germania, ceria, and co-formed products thereof, and mixtures thereof. The abrasive can be a fumed product. Preferably, the abrasive of the system is alumina (e.g., fumed alumina) and/or silica (e.g., fumed silica).

The abrasive, as described above, can be fixed, in whole or in part, in or on the polishing pad of the system. Moreover, the abrasive can be present in the liquid portion of the system in any suitable amount. Preferably, the abrasive is present in the liquid portion of the system in an amount of about 0.1–30 wt. %. More preferably, the abrasive is present in the liquid portion of the system in an amount of about 0.5–6 wt. %.

The system of the present invention further may comprise one or more additional additives that improve or enhance the performance of the system. Suitable additional additives include, for example, passivation film-forming additives, polymeric compounds that reduce the polishing rate of at least one layer of the substrate, dispersants, surfactants, stabilizers, pH adjusters, regulators, buffers, and/or other additives that promote and/or control the polishing of metals and oxides. Such additional additives are known to those of skill in the art.

Suitable passivation film-forming agents include, for example any compound, or mixture of compounds, that facilitates the formation of a passivation layer (i.e., a dissolution-inhibiting layer) on a metal layer and/or a metal oxide layer. Suitable passivation film-forming agents include, for example, nitrogen-containing heterocyclic compounds. Preferably, the passivation film-forming agent comprises one or more 5–6 member heterocyclic nitrogen-containing rings. More preferably, the passivation film-forming agent is selected from the group consisting of 1,2,3-triazole, 1,2,4-triazole, benzotriazole, benzimidazole, benzothiazole, and derivatives thereof, such as, for example, hydroxy-, amino-, imino-, carboxy-, mercapto-, nitro-, urea-, thiourea-, or alkyl-substituted derivatives thereof. Most preferably, the passivation film-forming agent is selected from the group consisting of benzotriazole (BTA), 1,2,3-triazole, 1,2,4-triazole, and mixtures thereof.

The passivation film-forming agent can be present in the system of the present invention in any suitable concentration. Preferably, the passivation film-forming agent is present in the liquid portion of the system in an amount of about 0.005–1 wt. %. Preferably, the passivation film-forming agent is present in the liquid portion of the system in an amount of about 0.01–0.2 wt. %.

The system of the present invention further can comprise a source of ammonia (e.g., ammonia or an ammonium salt). Ammonia and/or ammonium salts enhance the removal rate and/or removal selectivity (e.g., Cu:Ta removal selectivity) of the system, by interacting with one or more components of the system (e.g., the polishing additive). Preferably, the system of the present invention comprises ammonia and/or ammonium salts and one or more polishing additives. Preferably, the system comprises a source of ammonia and at least one polishing additive selected from the group consisting of a carboxylic acid (preferably, a di-, tri-, or poly-carboxylic acid), a phosphate (preferably, a pyrophosphate, a tri-phosphate, or a condensed phosphate), an acid thereof, and a phosphonic acid (preferably, a di-, tri-, or poly-phosphonic acid). For example, the system can comprise aminotri(methylenephosphonic acid) and a source of ammonia (e.g., ammonia and/or an ammonium salt).

Suitable polymeric compounds include, for example, any suitable polymeric compound that reduces the polishing rate of at least one layer associated with the substrate. Preferably, the system comprises at least one polymeric compound comprising a polyvinylalcohol, a polyethylene oxide, a polypropylene oxide, a sulfonic acid polymer, a sulfonate polymer, or a mixture thereof.

Suitable surfactants include, for example, cationic surfactants, anionic surfactants, nonionic surfactants, amphoteric surfactants, fluorinated surfactants, mixtures thereof, and the like. Suitable pH adjusters, regulators, or buffers include, for example, sodium hydroxide, sodium carbonate, sulfuric acid, hydrochloric acid, nitric acid, phosphoric acid, citric acid, potassium phosphate, mixtures thereof, and the like.

The present invention also provides a method of polishing a substrate with a system as described herein. Moreover, the present invention provides a method of polishing a multi-layer substrate as described above with the system. The system of the present invention is capable of polishing a substrate (e.g., a multi-layer substrate) at a relatively high rate, e.g., removing the first metal layer, the second layer, and/or the one or more additional layers of the substrate at a relatively high rate.

A substrate can be treated with the system of the present invention by any suitable technique that involves the use of a polishing pad. Preferably, the system is applied to the surface of a substrate and polished, such that at least a portion of one or more layers of the substrate is removed. More preferably, the system is applied to the first metal layer of a multi-layer substrate that includes a first metal layer and a second layer, and the first metal layer is polished with the system until at least a portion of the first metal layer is removed from the substrate. A second polishing system, composition, and/or slurry can be used in a subsequent polishing step to remove at least a portion of a second layer, dielectric layer, and/or one or more additional layers of a multi-layer substrate. Preferably, the second polishing system has a greater polishing selectivity for the second layer (e.g., Ta or TaN) of the multi-layer substrate than for the first metal layer (e.g., Cu) of the substrate. Moreover, cleaning compositions can be used after some or all successive polishing steps, in order to remove remnants of the polished substrate and/or remnants of the polishing system, composition, and/or slurry.

It is suitable for the liquid portion of the system to be formulated prior to delivery to the polishing pad or to the surface of the substrate, e.g., in a batch or continuous process. It is also suitable for the liquid portion of the system to be formulated (e.g., mixed) on the surface of the polishing pad or on the surface of the substrate, through delivery of the components of the liquid portion of the system from two or more distinct sources, whereby the components meet at the surface of the polishing pad or at the surface of the substrate. In this regard, the flow rate at which the components of the liquid portion of the system are delivered to the polishing pad or to the surface of the substrate (i.e., the delivered amount of the particular components of the system) can be altered prior to the polishing process and/or during the polishing process, such that the polishing selectivity and/or viscosity of the system is altered. Moreover, it is suitable for the particular components of the liquid portion of the system being delivered from two or more distinct sources to have different pH values, or alternatively to have substantially similar, or even equal, pH values, prior to delivery to the surface of the polishing pad or to the surface of the substrate. It is also suitable for the particular components being delivered from two or more distinct sources to be filtered either independently or to be filtered jointly (e.g., together) prior to delivery to the surface of the polishing pad or to the surface of the substrate.

EXAMPLES

The following examples further illustrate the present invention but, of course, should not be construed as in any way limiting its scope.

The tantalum wafers referenced in all of the following examples and the copper wafers referenced in all but one of the following examples (i.e., Example 4) were tantalum blanket films and copper blanket films, respectively. The silicon dioxide wafers referenced in all of the following examples were blanket films with a thickness of approximately 9000 Å. All blanket films were deposited on a silicon substrate.

The copper, tantalum, and silicon dioxide wafers in the following examples (hereinafter collectively referred to as "test wafers") were each polished with an IPEC472 polishing machine. The polishing pads used in all but one of the following examples (i.e., Example 4) were Rodel® IC1000 polishing pads stacked on Rodel® SUBA IV pads. The polishing pads used in Example 4 were Rodel® IC1000 polishing pads, without stacked Rodel® SUBA IV pads. The test wafers in all but one of the following examples (i.e., Example 4) were polished using a down force of about 20 kPa (3 psi), a back pressure of 0 kPa (0 psi), a table speed of 50 rpm, and a wafer holder speed of 30 rpm. The test wafers of Example 4 were polished using a down force of about 20 kPa (3 psi), a back pressure of about 14 kPa (2 psi), a table speed of 55 rpm, and a wafer holder speed of 30 rpm.

Test wafer removal rates were determined by directly measuring the thickness of each test wafer before and after polishing using a Tencor Surfscan® UV 1050 machine and a Tencor RS-75.

The systems in all but one of the following examples (i.e., Example 3) were adjusted to the target pH with ammonium hydroxide ($NH_4OH$), unless otherwise noted.

Example 1

This example illustrates that the polishing selectivity of a multi-layer substrate achievable by the system of the present invention is dependent on the presence and identity of the polishing additive and stopping compound in the system.

Copper wafers, tantalum wafers, and silicon dioxide ($SiO_2$) wafers were polished separately with eight different polishing systems (designated Systems 1A–1G) with 3 wt. % alumina (specifically, Cabot's Semi-Sperse® W-A355 product), 2.5 wt. % oxidizing agent (specifically, $H_2O_2$), varying concentrations of a polishing additive (specifically, 1.25 wt. % tartaric acid, 0.5 wt. % 1-diphosphonic acid (i.e., Dequest® 2010 product), 0.75 wt. % aminotri(methylenephosphonic acid) (i.e., Dequest® 2000 product), 0.8 wt. % Dequest® 2010 product, or 2.5 wt. % Dequest® 2000 product), and varying concentrations of a stopping compound (specifically, 0.25 wt. % Lupasol® SKA, which contains 25% of an ethylenimine polymer (i.e., 0.06 wt. % polyethylenimine), 0.1 wt. % dicyanoimidazole, 0.5 wt. % Lupasol SKA (i.e., 0.12 wt. % polyethylenimine), 0.5 wt. % polyacylamide, or 0.5 wt. % 1,4-bis(3-aminopropyl)piperazine, or 0.5 wt. % Varisoft® 300, which contains cetyltrimethylammonium chloride), wherein each of the systems had a pH of 5 (System 1E) or a pH of 7.7 (Systems 1A–D, 1F–1G). Moreover, System 1C contained 0.005 wt. % surfactant (specifically, Triton DF-16).

For comparison purposes, the test wafers also were polished with a control system ("control") with 3 wt. % alumina (specifically, Cabot's Semi-Sperse® W-A355 product) and 2.5 wt. % oxidizing agent (specifically, $H_2O_2$), wherein the control system had a pH of 7.7. Moreover, also for comparison purposes, the test wafers were polished with (i) a comparative system ("comparative 1") with 3 wt. % alumina (specifically, Cabot's Semi-Sperse® W-A355 product), 2.5 wt. % oxidizing agent (specifically, $H_2O_2$), and 1.25 wt. % polishing additive (specifically, tartaric acid), and (ii) a comparative system ("comparative 2") with 3 wt. % alumina (specifically, Cabot's Semi-Sperse® W-A355 product), 2.5 wt. % oxidizing agent (specifically, $H_2O_2$), and 1 wt. % polishing additive (specifically, Dequest® 2010 product), wherein each of the comparative systems had a pH of 7.7.

Following use of the systems, the removal rate (RR) of copper, tantalum, and $SiO_2$ by each system was determined, as well as the relative removal of copper to tantalum ("Cu:Ta"). The resulting data are set forth in Table 1.

TABLE 1

| System | Polishing Additive | Stopping Compound | Cu RR [Å/min] | Ta RR [Å/min] | $SiO_2$ RR [Å/min] | Cu:Ta |
|---|---|---|---|---|---|---|
| Control | none | none | 87 | 198 | — | 1:2 |
| Comparative 1 | 1.25 wt. % tartaric acid | none | 3615 | 133 | 53 | 27:1 |
| Comparative 2 | 1 wt. % Dequest ® 2010 | none | 4777 | 406 | — | 12:1 |
| 1A | 1.25 wt. % tartaric acid | 0.06 wt. % polyethylenimine | 2375 | 19 | 12 | 125:1 |
| 1B | 0.5 wt. % Dequest ® 2010 | 0.1 wt. % dicyanoimidazole | 3163 | 175 | 54 | 18:1 |
| 1C | 0.75 wt. % Dequest ® 2000 | 0.12 wt. % polyethylenimine | 3265 | 28 | 16 | 117:1 |
| 1D | 0.8 wt. % Dequest ® 2010 | 0.12 wt. % polyethylenimine | 2949 | 35 | 26 | 84:1 |
| 1E | 0.75 wt. % Dequest ® 2000 | 0.5 wt. % polyacylamide | 6381 | 43 | 28 | 148:1 |
| 1F | 2.5 wt. % Dequest ® 2000 | 0.5 wt. % 1,4-bis-(3-aminopropyl) piperazine | 3860 | 109 | 5.5 | 35:1 |
| 1G | 2.5 wt. % Dequest ® 2000 | 0.5 wt. % Varisoft ® 300 | 2260 | 97.6 | 3.6 | 23:1 |

As is apparent from the data set forth in Table 1, the ratio of copper removal to tantalum removal (i.e., the Cu:Ta removal selectivity) exhibited by systems containing a polishing additive and a stopping compound (Systems 1A–1G) were greater than the Cu:Ta removal selectivity of both the control polishing system and of the comparative 2 polishing system, and were similar to or greater than the Cu:Ta removal selectivity of the comparative 1 polishing system. Moreover, the $SiO_2$ removal rate exhibited by systems containing a polishing additive and a stopping compound (Systems 1A–1G) were similar to or less than the $SiO_2$ removal rate exhibited by the comparative 1 polishing system.

These results demonstrate the significance of the combination of a polishing additive and a stopping compound in the context of the present inventive system, as well as the effect of the particular polishing additive, in combination with the particular stopping compound, on the polishing rate and selectivity achievable by the present inventive system and method.

Example 2

This example illustrates that the polishing selectivity of a multi-layer substrate achievable by the system of the present invention is dependent on the presence and identity of the polishing additive and stopping compound in the system.

Copper wafers, tantalum wafers, and silicon dioxide ($SiO_2$) wafers were polished separately with three different polishing systems (designated Systems 2A–2C) with 5 wt. % silica (specifically, Cabot's Cab-O-Sperse® SC-E product), 2.5 wt. % oxidizing agent (specifically, $H_2O_2$), varying concentrations of a polishing additive (specifically, 0.8 wt. % 1-di-phosphonic acid (i.e., Dequest® 2010 product), 0.75 wt. % aminotri(methylenephosphonic acid) (i.e., Dequest® 2000 product), or 0.75 wt. % diethylenetriaminepenta(methylenephosphonic acid) (i.e., Dequest® 2060 product)), and 0.5 wt. % stopping compound (specifically, 0.5 wt. % Lupasol®SKA, which contains 25% of an ethylenimine polymer (i.e., 0.12 wt. % polyethylenimine)), wherein each of the systems had a pH of 7.7. For comparison purposes, the test wafers also were polished with a control system ("control") with 5 wt. % silica (specifically, Cabot's Cab-O-Sperse® SC-E product) and 2.5 wt. % oxidizing agent (specifically, $H_2O_2$), wherein the control system had a pH of 8. Following use of the systems, the removal rate (RR) of copper, tantalum, and $SiO_2$ by each system was determined, as well as the relative removal of copper to tantalum ("Cu:Ta"), with the resulting data set forth in Table 2.

TABLE 2

| System | Polishing Additive | Stopping Compound | Cu RR [Å/min] | Ta RR [Å/min] | $SiO_2$ RR [Å/min] | Cu:Ta |
|---|---|---|---|---|---|---|
| Control | none | none | 306 | 383 | 299 | 1:1.3 |
| 2A | 0.8 wt. % Dequest® 2010 | 0.12 wt. % Lupasol SKA | 1789 | 13 | 5 | 138:1 |
| 2B | 0.75 wt. % Dequest® 2000 | 0.12 wt. % Lupasol SKA | 1733 | 9 | 20 | 193:1 |
| 2C | 0.75 wt. % Dequest® 2060 | 0.12 wt. % Lupasol SKA | 2132 | 7 | 12 | 305:1 |

As is apparent from the data set forth in Table 2, the ratio of copper removal to tantalum removal (i.e., the Cu:Ta removal selectivity) exhibited by systems containing a polishing additive and a stopping compound (Systems 2A–2C) were greater than the Cu:Ta removal selectivity of the control system that did not contain a polishing additive or a stopping compound. Moreover, the copper removal rate and the Cu:Ta removal selectivity of the system containing a stopping compound and Dequest® 2060 product (System 2C) were greater than the copper removal rate and the Cu:Ta removal selectivity of the system containing a stopping compound and Dequest® 2000 product (System 2B), which in turn were greater than the copper removal rate and the Cu:Ta removal selectivity of the system containing a stopping compound and Dequest® 2010 product (System 2A). Moreover, the $SiO_2$ removal rate exhibited by systems containing a polishing additive and a stopping compound (Systems 2A–2C) were greater than the $SiO_2$ removal rate of the control system that did not contain a polishing additive or a stopping compound.

These results demonstrate the significance of the combination of a polishing additive and a stopping compound in the context of the present inventive system, as well as the effect of the particular polishing additive, in combination with the stopping compound, on the polishing rate and selectivity achievable by the present inventive method.

Example 3

This example illustrates that the polishing selectivity of a multi-layer substrate achievable by the system of the present invention is dependent on the identity of the stopping compound in the system.

Copper wafers, tantalum wafers, and silicon dioxide ($SiO_2$) wafers were polished separately with fourteen different polishing compositions with 3 wt. % alumina (specifically, Cabot's Semi-Sperse® W-A355 product), 2.5 wt. % oxidizing agent (specifically, $H_2O_2$), 1 wt. % polishing additive (specifically, ammonium oxalate (($NH_4)_2$ $C_2O_4$)), and varying concentrations of a stopping compound (specifically, 0.2 wt. % isophoronediamine, 0.2 wt. % hexamethylenediamine, 0.2 wt. % N-cyclohexyl-1,3-propanediamine, 0.2 wt. % N-(3-aminopropyl)-1,3-propanediamine, 0.2 wt. % tetraethylenepentamine, 0.2 wt. % N,N,N',N'-tetramethyl-1,4-butanediamine, 0.5 wt. % propylamine, 0.2 wt. % 2-(2-aminoethoxy)ethanol, 2.0 wt. % 1,3-diamino-2-propanol, 1.0 wt. % thiomicamine, 3.0 wt. % 2-amino-1-butanol, 0.2 wt. % 4,7,10-trioxa-1,13-tridecanediamine, 0.2 wt. % lysine, 0.2 wt. % poly[bis(2-chloroether)-alt-1,3-bis(3-dimethylamino)propyl]), wherein each of the systems had a pH of 7.6. For comparison purposes, the test wafers also were polished with a control system ("control") with 3 wt. % alumina (specifically, Cabot's Semi-Sperse® W-A355 product), 2.5 wt. % oxidizing agent (specifically, $H_2O_2$), and 1 wt. % polishing additive (specifically, ammonium oxalate ($NH_4)_2C_2O_4$), wherein the control system had a pH of 7.6. Following use of the polishing compositions, the relative tantalum (Ta) removal rate and the relative silicon dioxide ($SiO_2$) removal rate of each system were determined in comparison with the removal rates of the control system, with the resulting data set forth in Table 3.

TABLE 3

| System | Stopping Compound | Relative Removal Rate Ta | Relative Removal Rate $SiO_2$ |
|---|---|---|---|
| Control | none | 1 | 1 |
| 3A | 0.2 wt. % isophoronediamine | 0.17 | — |
| 3B | 0.2 wt. % hexamethylenediamine | 0.24 | 0.27 |
| 3C | 0.2 wt. % N-cyclohexyl-1,3-propanediamine | 0.12 | 0.11 |
| 3D | 0.2 wt. % N-(3-aminopropyl)-1,3-propanediamine | 0.17 | 0.03 |
| 3E | 0.2 wt. % tetraethylenepentamine | 0.21 | 0.13 |
| 3F | 0.2 wt. % N,N,N',N'-tetramethyl-1,4-butanediamine | — | 0.37 |
| 3G | 0.5 wt. % propylamine | 0.17 | — |
| 3H | 0.2 wt. % 2-(2-aminoethoxy)ethanol | 0.71 | — |
| 3I | 3.0 wt. % 2-amino-1-butanol | 0.04 | 0.21 |
| 3J | 0.2 wt. % 4,7,10-trioxa-1,13-tridecanediamine | 0.28 | 0.22 |
| 3K | 0.2 wt. % lysine | 0.35 | 1.1 |
| 3L | 0.2 wt. % poly[bis(2-chloroether)-alt-1,3-bis(3-dimethylamino)propyl] | — | 0.33 |

As is apparent from the data set forth in Table 3, the relative tantalum removal rates exhibited by the evaluated polishing systems containing a polishing additive and a stopping compound were desirably less than the relative tantalum removal rate of the control polishing composition that did not contain both a polishing additive and a stopping compound. Moreover, the relative $SiO_2$ removal rates exhibited by all but one of the evaluated polishing systems containing a polishing additive and a stopping compound were desirably less than the relative $SiO_2$ removal rate of the control polishing system that did not contain both a polishing additive and a stopping compound.

These results demonstrate the significance of the presence of a stopping compound in the context of the present inventive system, as well as the effect of the particular stopping compound, on the removal rate and selectivity achievable by the present inventive method.

Example 4

This example illustrates that the polishing selectivity of a multi-layer substrate achievable by the system of the present invention, as well as the minimization of surface defects by the system, is dependent on the identity of the stopping compound in the system.

Copper wafers, tantalum wafers, and silicon dioxide ($SiO_2$) wafers were polished separately with two different polishing systems (designated Systems 4A and 4B) with 3 wt. % alumina (specifically, Cabot's Semi-Sperse® W-A355 product), 2.5 wt. % oxidizing agent (specifically, $H_2O_2$), 1.25 wt. % polishing additive (specifically, tartaric acid), and either 0 wt. % or 0.06 wt. % stopping compound (specifically, an ethylenimine polymer (i.e., Lupasol SKA)), wherein each of the systems had a pH of 7.7. Following use of the systems, the relative removal of copper to tantalum ("Cu:Ta"), copper dishing, and $SiO_2$ erosion were measured, with the resulting data set forth in Table 3. Wafer dishing of copper lines (i.e., copper dishing) and $SiO_2$ erosion were determined through use of a Tencor P-20 Long Scan Profiler. Copper dishing was measured at a 10 μm feature size and at a 50 μm feature size ("10 μm/50 μm"). $SiO_2$ erosion was measured for an array having a 2 μm line and a 4 μm pitch ("2 μm/4 μm array").

TABLE 4

| System | Polishing Additive | Stopping Compound | Cu:Ta | Cu Dishing [10 μm/50 μm] | SiO₂ Erosion [2 μm/4 μm array] |
|---|---|---|---|---|---|
| 4A | 1.25 wt. % tartaric acid | None | 81:1 | 952 Å/ 1868 Å | 896 Å |
| 4B | 1.25 wt. % tartaric acid | 0.06 wt. % Lupasol ® SKA | 220:1 | 840 Å/ 1552 Å | 714 Å |

As is apparent from the data set forth in Table 4, the ratio of copper removal to tantalum removal (i.e., the Cu:Ta removal selectivity) exhibited by the system containing a polishing additive and a stopping compound (System 4B) were greater than the Cu:Ta removal selectivity exhibited by the system containing only a polishing additive (System 4A). Moreover, Cu dishing and $SiO_2$ erosion exhibited by the system containing a polishing additive and a stopping compound (System 4B) were less than the Cu dishing and $SiO_2$ erosion exhibited by the system containing only a polishing additive (System 4A).

These results demonstrate the significance of the presence of a stopping compound in the context of the present inventive system on the polishing selectivity achievable by the system, as well as the minimization of surface defectivity of the polished substrate by the system of the present invention.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method for polishing one or more layers of a multi-layer substrate that includes a first metal layer and a second layer comprising:
    (i) contacting the first metal layer with a polishing system comprising:
        (a) a liquid carrier,
        (b) at least one oxidizing agent,
        (c) at least one carboxylic acid that increases the rate at which the system polishes at least one layer of the substrate,
        (d) polyethylenimine,
        (e) a polishing pad and/or an abrasive, and
    (ii) polishing the first metal layer with the system until at least a portion of the first metal layer is removed from the substrate.

2. The method of claim 1, wherein the liquid carrier is a nonaqueous solvent.

3. The method of claim 1, wherein the liquid carrier is water.

4. The method of claim 3, wherein the system comprises an abrasive, and the abrasive is suspended in the liquid carrier.

5. The method of claim 3, wherein the system comprises an abrasive, and the abrasive is fixed on the polishing pad.

6. The method of claim 3, wherein no abrasive is present in the system, and the polishing pad is not an abrasive-containing pad.

7. The method of claim 3, wherein the polyethlenimine present in the liquid carrier in a concentration of about 5 wt. % or less.

8. The method of claim 3, wherein at least one carboxylic acid is selected from the group consisting of di-carboxylic acids, tri-carboxylic acids, poly-carboxylic acids, and mixtures thereof.

9. The method of claim 8, wherein at least one oxidizing agent is a peroxide, and wherein the system further comprises at least one passivation film forming agent comprising one or more 5–6 member heterocyclic nitrogen-containing rings.

10. The method of claim 8, wherein at least one carboxylic acid selected from poly-carboxylic acids.

11. The method, of claim 3, wherein at least one oxidizing agent is a peroxide, and wherein the system further comprises at least one passivation film forming agent comprising one or more 5–6 member heterocyclic nitrogen-containing rings.

12. The method of claim 3, wherein the polyethylenime molecular weight greater than about 100.

13. The method of claim 3, wherein the system comprises a peroxide and tartaric acid.

14. The method of claim 3, wherein the system further comprises at least one polymeric compound that reduces the polishing rate of at least one layer associated with the substrate.

15. The method of claim 3, wherein the system further comprises at least one passivation film forming agent.

16. The method of claim 3, wherein the abrasive is a metal oxide abrasive.

17. The method of claim 16, wherein the abrasive is selected from the group consisting of alumina, ceria, germania, silica, titania, zirconia, and coformed products thereof, and mixtures thereof.

18. The method of claim 17, wherein the abrasive is alumina.

19. The method of claim 3, wherein at least one carboxylic acid and the polyethylenimine have a molecular weight of about 250 or more.

20. The method of claim 1, wherein the first metal layer comprises copper, aluminum, titanium, tungsten, platinum, ruthenium, iridium, and combinations thereof.

21. The method of claim 1, wherein the first metal layer is platinum, ruthenium, or iridium.

* * * * *